(12) United States Patent
Bae et al.

(10) Patent No.: US 9,780,319 B2
(45) Date of Patent: Oct. 3, 2017

(54) ORGANIC LIGHT EMITTING DIODE DISPLAY DEVICE

(71) Applicant: LG DISPLAY CO., LTD., Seoul (KR)

(72) Inventors: Hyo-Dae Bae, Gyeonggi-do (KR); Young-Mu Oh, Seoul (KR); Jeong-Won Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 2 days.

(21) Appl. No.: 14/918,805

(22) Filed: Oct. 21, 2015

(65) Prior Publication Data
US 2016/0111674 A1 Apr. 21, 2016

(30) Foreign Application Priority Data
Oct. 21, 2014 (KR) .................. 10-2014-0142871

(51) Int. Cl.
*H01L 51/50* (2006.01)
*H01L 51/52* (2006.01)
*H01L 27/32* (2006.01)

(52) U.S. Cl.
CPC ...... *H01L 51/5012* (2013.01); *H01L 51/5088* (2013.01); *H01L 51/5218* (2013.01); *H01L 51/5265* (2013.01); *H01L 27/3206* (2013.01); *H01L 27/3211* (2013.01); *H01L 2251/558* (2013.01)

(58) Field of Classification Search
CPC .................. H01L 2251/558; H01L 2251/566
See application file for complete search history.

(56) References Cited

U.S. PATENT DOCUMENTS 8,916,862 B2 * 12/2014 Kurata ................ H01L 51/5265
257/40
8,933,471 B2 * 1/2015 Kurata ................ H01L 27/3211
257/40

(Continued)

FOREIGN PATENT DOCUMENTS

KR 10-2005-0014437 A 2/2005
KR 10-0823511 B1 4/2008
KR 10-2011-0027990 A 3/2011

OTHER PUBLICATIONS

Sony Corporation, Full-Color Organic EL Panels Based on Sony's Unique "Super Top Emission" Technology, CX News, vol. 39, Feb. 2005.

*Primary Examiner* — Fernando L Toledo
*Assistant Examiner* — Valerie N Newton
(74) *Attorney, Agent, or Firm* — Morgan, Lewis & Bockius LLP

(57) ABSTRACT

An organic electroluminescent device includes a substrate having a plurality of pixel regions defined thereon; and, in each pixel region, at least first, second and third light emitting elements formed on the substrate, each of the first, second, and third light emitting elements including a lower first electrode, an upper first electrode, an organic-light emitting layer, and a second electrode. A ratio of a thickness of the upper first electrode to a thickness of the organic light emitting layer in the first light emitting element is 1:3 to 1:4. A ratio of a thickness of the upper first electrode to a thickness of the organic light emitting layer in the second light emitting element is 1:2.5 to 1:3. A ratio of a thickness of the upper first electrode to a thickness of the organic light emitting layer in the third light emitting element is 1:1.5 to 1:2.

14 Claims, 6 Drawing Sheets

(56) References Cited

U.S. PATENT DOCUMENTS

2008/0111474 A1    5/2008  Sung et al.
2010/0006872 A1*  1/2010  Seo ...................... H01L 27/156
                                                                  257/89

* cited by examiner (Comparison Embodiment)

ORGANIC LIGHT EMITTING DIODE DISPLAY DEVICE

CROSS-REFERENCE TO RELATED APPLICATIONS

The present application claims the benefit of priority of Korean Patent Application No. 10-2014-0142871 filed on Oct. 21, 2014, which is hereby incorporated by reference for all purposes as if fully set forth herein.

BACKGROUND OF THE INVENTION

Field of the Invention

The present disclosure relates to an organic light emitting diode display device and, more particularly, to an organic light emitting diode display device having a microcavity effect.

Discussion of the Related Art

Among various flat panel displays (FPDs), an organic light emitting diode (OLED) display device has superior properties such as high luminance and low driving voltage. The OLED display device uses an emissive electroluminescent layer to realize a high contrast ratio and a thin profile, and is excellent at displaying a moving image because of a short response time of several micro seconds (μsec). Also, the OLED display device has no limitation on a viewing angle and is stable even in a low temperature. Since the OLED display device is typically driven by a low voltage of about 5V to about 15V in direct current (DC), fabrication and design of a driving circuit is easy. Accordingly, the OLED display device has been used for various information technology (IT) devices, such as televisions, monitors and portable phones.

In general, an OLED display device includes an array element and a light emitting diode. The array element includes a switching thin film transistor (TFT) connected to a gate line and a data line and a driving TFT connected to the light emitting diode. The light emitting diode includes a first electrode connected to the driving TFT, an emitting layer, and a second electrode.

The light generated in the emitting layer is emitted through the first electrode or the second electrode to display an image. Recently, a top emission type OLED display device where the light is emitted through the second electrode has been widely used in consideration of an aperture ratio. In the top emission type OLED display device, the distances between the first and second electrodes are different from each other in red, green and blue pixel regions for improving a color purity of red, green, and blue and for increasing emission efficiency due to a microcavity effect.

The emitting layer may be formed by a vacuum thermal evaporation method using a shadow mask. However, as a size of the display device increases, a sagging occurs in the shadow mask and deterioration in evaporation increases. As a result, it becomes more difficult to apply the vacuum thermal evaporation method to the large-sized substrate. In addition, because a shadow effect occurs in the vacuum thermal evaporation method, it is difficult to fabrication of the OLED display device having a high resolution over 250 PPI (pixel per inch) is more difficult by the current technology.

Further, because the thermal evaporation method using the shadow mask is performed in a vacuum state, a vacuum chamber is required for obtaining the vacuum state. In addition, since an additional process and additional time are required for changing the inside of the vacuum chamber from an atmospheric pressure state to a vacuum state, productivity per hour decreases and fabrication cost increases.

As a result, an inkjet method of forming the emitting layer substituted for the vacuum thermal evaporation using the shadow mask has been suggested. In the inkjet method, after an inkjet apparatus jets an emitting material of a liquid phase inside a bank layer, the emitting material is cured. Since the emitting layer is selectively formed in a predetermined region by the inkjet apparatus, waste of a material is prevented. Further, the inkjet apparatus has an advantage in maintenance and management.

However, since an amount of an emitting material jetted by a single drop is determined due to limitations of the inkjet apparatus, the emitting layer having a thickness for the microcavity effect is not formed by the single drop in the inkjet apparatus. Accordingly, the emitting layer is formed by multiple drops over three repetitions. After the emitting material is jetted by a drop, a drying step for the jetted emitting material is performed for a long time period over several tens of minutes before the process can be repeated for the next drop. As the number of drops of the emitting material increases, productivity per hour decreases.

SUMMARY

Accordingly, the present invention is directed to an organic light emitting diode display device that substantially obviates one or more of the problems due to limitations and disadvantages of the related art.

An object of the present invention is to provide an OLED display device where an emitting layer has a thickness to have a microcavity effect through an inkjet method and the number of drops of an emitting material is reduced.

Additional advantages, objects, and features of the invention will be set forth in the description which follows, and in part will become apparent from the description, or may be learned by practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic electroluminescent device comprises a substrate having a plurality of pixel regions defined thereon; and, in each pixel region, at least first, second and third light emitting elements formed on the substrate, each of the first, second, and third light emitting elements including a lower first electrode, an upper first electrode, an organic-light emitting layer, and a second electrode, wherein a ratio of a thickness of the upper first electrode to a thickness of the organic light emitting layer in the first light emitting element is 1:3 to 1:4, wherein a ratio of a thickness of the upper first electrode to a thickness of the organic light emitting layer in the second light emitting element is 1:2.5 to 1:3, and wherein a ratio of a thickness of the upper first electrode to a thickness of the organic light emitting layer in the third light emitting element is 1:1.5 to 1:2.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments in accordance with the invention and together with the description serve to explain the principles of the embodiments in accordance with the invention. In the drawings.

DETAILED DESCRIPTION OF THE ILLUSTRATED EMBODIMENTS

Reference will now be made in detail to exemplary embodiments, examples of which are illustrated in the accompanying drawings. The same reference numbers may be used throughout the drawings to refer to the same or like parts. In the following description, detailed descriptions of known functions and configurations incorporated herein will be omitted when it may obscure the subject matter of the present embodiments.

Hereinafter, the example embodiments will be described in detail with reference to FIGS. 1 to 6.

Figure 1:
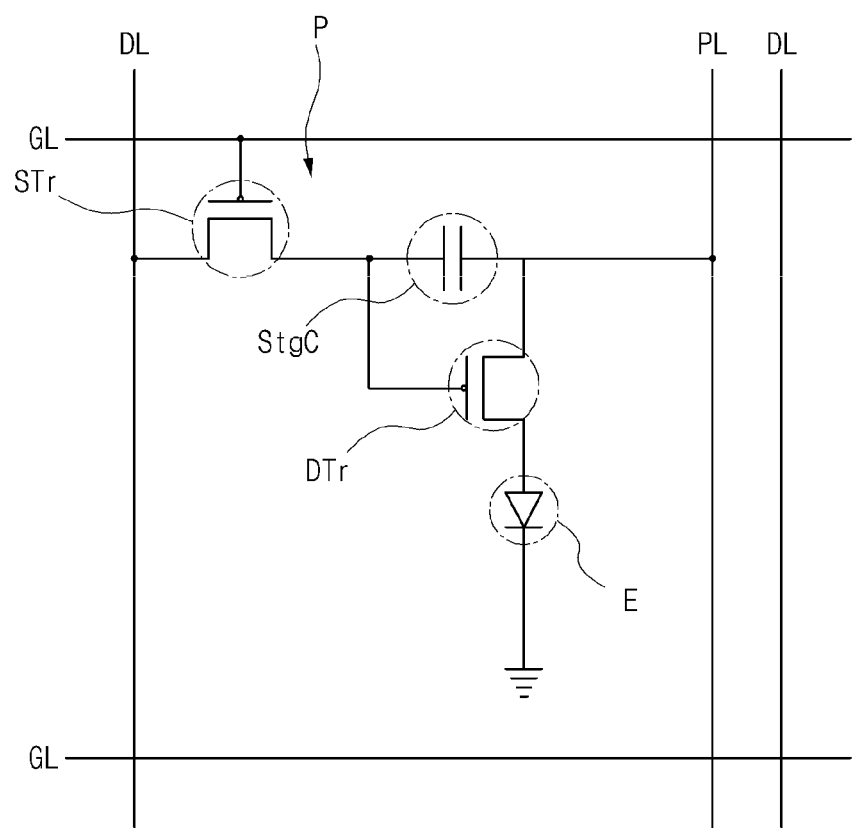
FIG. 1 is a view showing a pixel region of an organic light emitting diode display device according to a first embodiment of the present disclosure.

FIG. 1 is a view showing a pixel region of an organic light emitting diode display device according to a first embodiment of the present disclosure.

In FIG. 1, a gate line GL crosses a data line DL and a power line PL to define a pixel region P. A switching thin film transistor (TFT) STr, a driving TFT DTr, a storage capacitor StgC and a light emitting diode E are formed in a pixel region. The switching TFT STr is connected to the gate line GL and the data line DL, and the driving TFT DTr is connected to the switching TFT STr. A first electrode of the light emitting diode E is connected to a drain electrode of the driving TFT DTr, and a second electrode of the light emitting diode E is grounded. The power voltage of the power line PL is applied to the light emitting diode E through the driving TFT DTr. The storage capacitor StgC is connected between a gate electrode and a source electrode of the driving TFT DTr.

When a gate signal is supplied to the gate line GL, the switching TFT STr is turned on and a data signal of the data line DL is applied to the gate electrode of the driving TFT DTr. As a result, the driving TFT DTr is turned on and the light emitting diode E emits a light.

When the driving TFT DTr is turned on, a level of a current of the light emitting diode E through the power line PL is determined so that the light emitting diode E can display a gray scale. The storage capacitor StgC keeps a voltage of the gate electrode of the driving TFT DTr constant while the switching TFT STr is turned off. Accordingly, the level of the current of the light emitting diode E may be kept constant until a next frame, even when the switching TFT STr is turned off.

Figure 2:
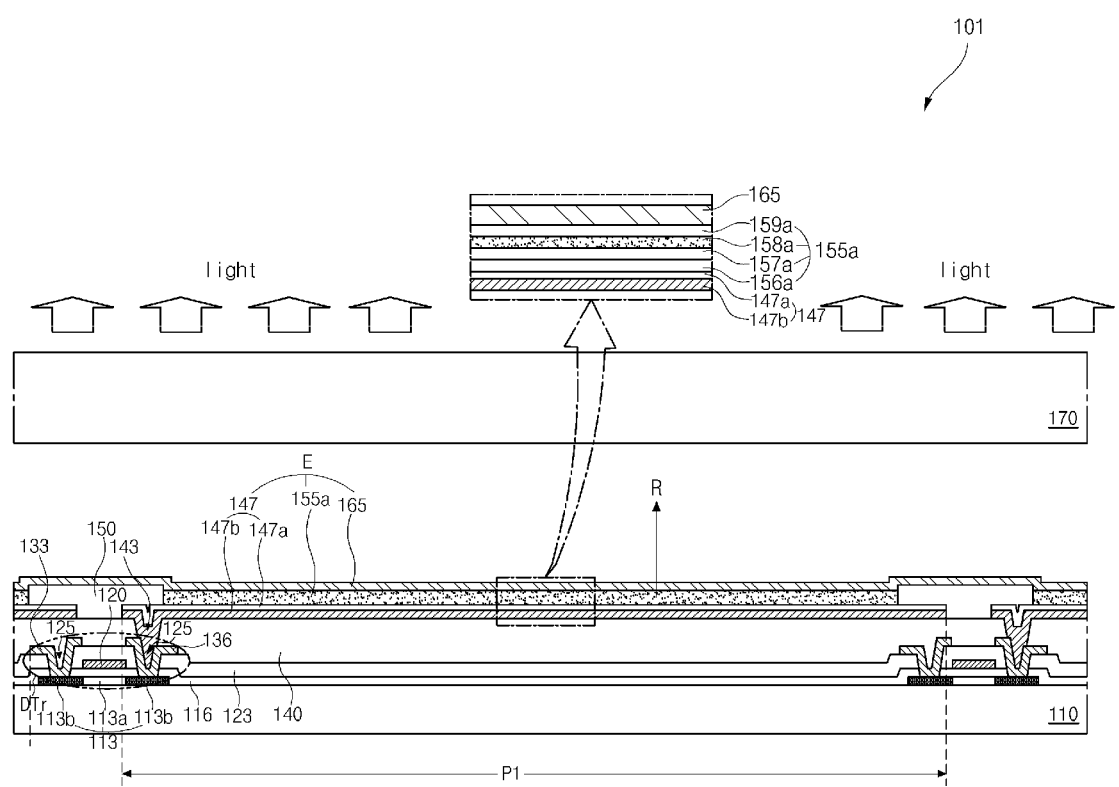
FIG. 2 is a cross-sectional view showing a pixel region of an organic light emitting diode display device according to the first embodiment of the present disclosure.
Figure 3:
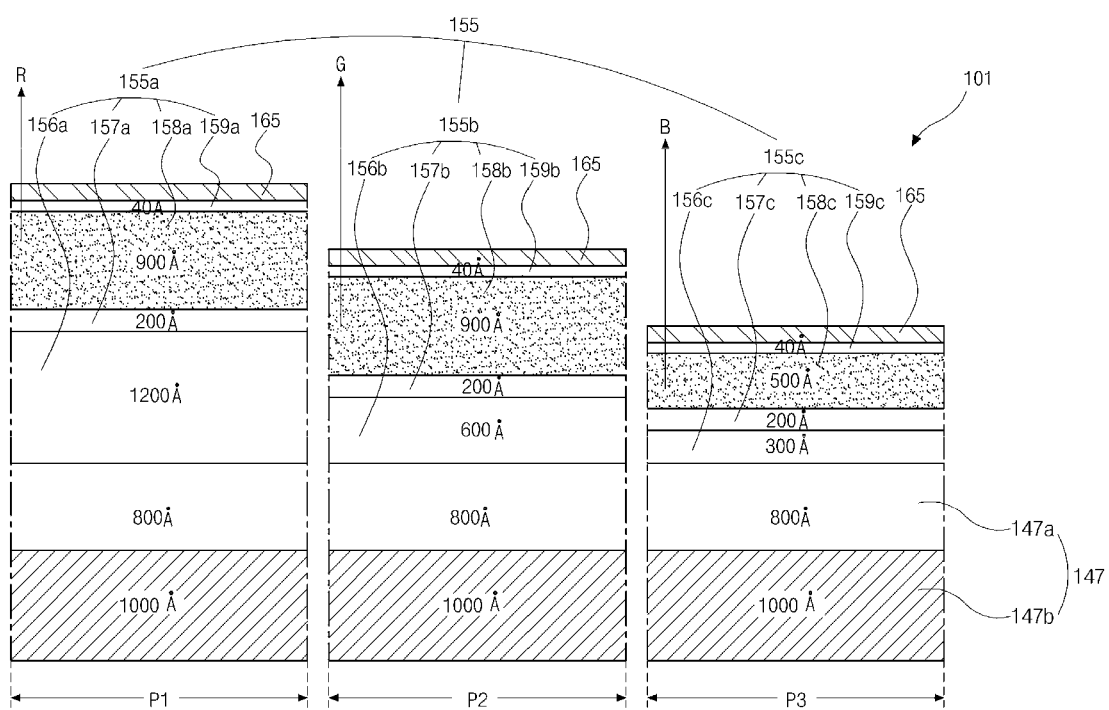
FIG. 3 is a cross-sectional view showing light emitting diodes in three pixel regions of an organic light emitting diode display device according to the first embodiment of the present disclosure.
Figure 4:
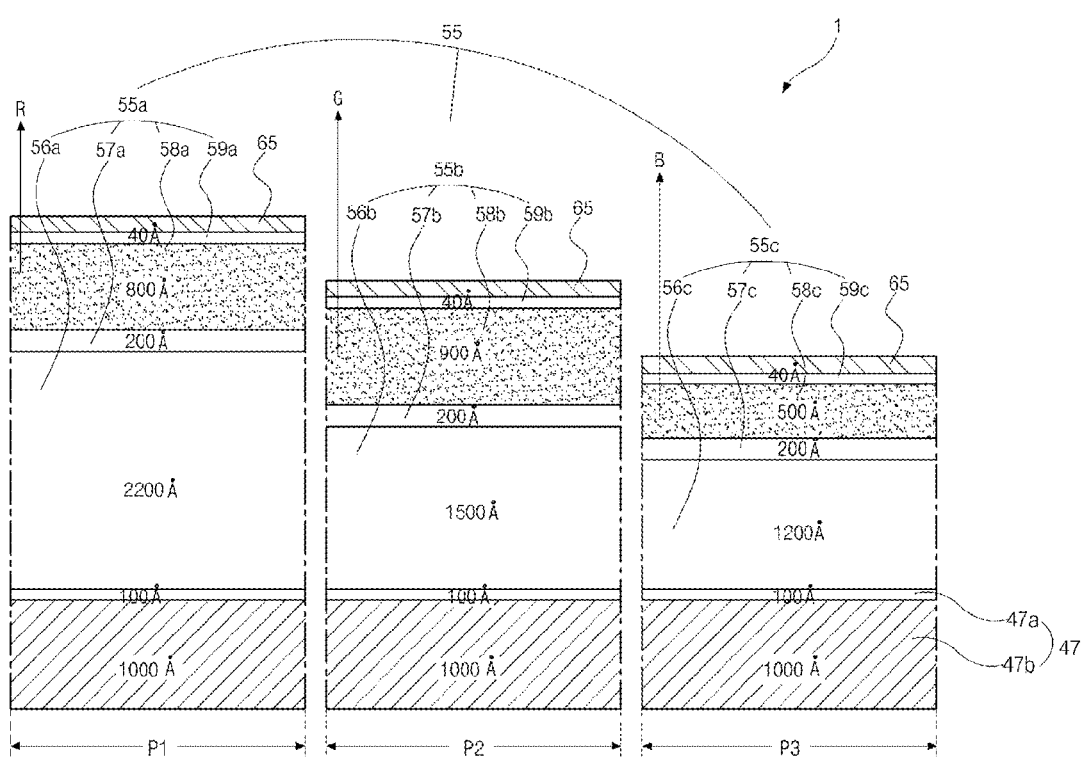
FIG. 4 is a cross-sectional view showing light emitting diodes in three pixel regions of an organic light emitting diode display device according to a comparison embodiment.

FIG. 2 is a cross-sectional view showing a pixel region of an organic light emitting diode display device according to the first embodiment of the present disclosure, FIG. 3 is a cross-sectional view showing light emitting diodes in three pixel regions (e.g., subpixels) of an organic light emitting diode display device according to the first embodiment of the present disclosure, and FIG. 4 is a cross-sectional view showing light emitting diodes in three pixel regions of an organic light emitting diode display device according to a comparison embodiment.

In FIGS. 2 and 3, an organic light emitting diode (OLED) display device 101 includes a first substrate 110 and a second substrate 170 for encapsulation. A switching thin film transistor (TFT) STr (of FIG. 1), a driving TFT DTr, and a light emitting diode E are formed on an inner surface of the first substrate 110. The second substrate 170 may be omitted in another embodiment by forming an inorganic insulating layer or an organic insulating layer on a top surface of the first substrate 110. A structure of second and third pixel regions P2 and P3 for green and blue colors is the same as a structure of a first pixel region P1 for a red color except for thicknesses of organic layers of the light emitting diode E. Of course, it should be recognized that the OLED structure may use other color combinations.

A semiconductor layer 113 including a first region 113a at a central portion thereof and second regions 113b at both sides of the first region 113a is formed on the first substrate 110. The first region 113a may be formed of intrinsic polycrystalline silicon to function as a channel, and the second regions 113b may be formed of an impurity-doped polycrystalline silicon to function as a source and a drain. Although not shown, a buffer layer of an inorganic insulating material, such as silicon oxide ($SiO_2$) and silicon nitride (SiNx), may be formed between the first substrate 110 and the semiconductor layer 113. The buffer layer may prevent deterioration of the semiconductor layer 113 due to alkali ions erupting from the first substrate 110 during a crystallization process for the semiconductor layer 113.

A gate insulating layer 116 is formed on the semiconductor layer 113, and a gate electrode 120 is formed on the gate insulating layer 116 over the first region 113a of the semiconductor layer 113. In addition, a gate line GL (of FIG. 1) connected to the gate electrode 120 is formed on the gate insulating layer 116.

An interlayer insulating layer 123 of an inorganic insulating material, such as silicon oxide ($SiO_2$) and silicon nitride (SiNx), is formed on the gate electrode 120 and the gate line GL. The interlayer insulating layer 123 and the gate insulating layer 116 have semiconductor contact holes 125 exposing the second regions 113b of the semiconductor layer 113.

A data line DL (of FIG. 1) and a power line PL (of FIG. 1) crossing the gate line GL are formed on the interlayer insulating layer 123. In addition, a source electrode 133 and a drain electrode 136 spaced apart from each other are formed on the interlayer insulating layer 123. The source electrode 133 and the drain electrode 136 are connected to the second regions 113b of the semiconductor layer 113 through the semiconductor contact holes 125.

The semiconductor layer 113, the gate insulating layer 116, the gate electrode 120, the interlayer insulating layer 123, the source electrode 133, and the drain electrode 136 constitute the driving TFT DTr. The switching TFT STr may have the same structure as the driving TFT DTr. The switching TFT STr is connected to the gate line GL, the data line DL, and the driving TFT DTr.

Although the switching TFT STr and the driving TFT DTr have a top gate type including the semiconductor layer 113 of polycrystalline silicon in the first embodiment, the switching TFT and the driving TFT may have a bottom gate type including a semiconductor layer of amorphous silicon or an oxide semiconductor material in another embodiment.

The switching TFT and the driving TFT of a bottom gate type may include a gate electrode, a gate insulating layer on the gate electrode, a semiconductor layer having an active layer of intrinsic amorphous silicon and an ohmic contact layer of impurity-doped amorphous silicon on the gate insulating layer over the gate electrode, and source and drain electrodes on the ohmic contact layer. Alternatively, the switching TFT and the driving TFT of a bottom gate type may include a gate electrode, a gate insulating layer on the gate electrode, a semiconductor layer of an oxide semiconductor layer on the gate insulating layer over the gate electrode, an etch stopper on the semiconductor layer, and source and drain electrodes on the etch stopper.

In the first substrate having the switching TFT and the driving TFT of a bottom gate type, the gate line may be formed of the same layer as the gate electrode to be connected to the gate electrode, and the data line may have the same layer as the source and drain electrodes to be connected to the source electrode of the switching TFT.

A first passivation layer 140 is formed on the switching TFT STr and the driving TFT DTr. The first passivation layer 140 includes a drain contact hole 143 exposing the drain electrode 136 of the driving TFT DTr. The first passivation layer 140 may be formed of an organic insulating material such as photo acryl to have a flat top surface. In another embodiment, a second passivation layer of an inorganic insulating material may be formed between the switching TFT STr and the driving TFT DTr and the first passivation layer 140, and the first passivation layer 140 and the second passivation layer may include the drain contact hole 143.

A first electrode 147 is formed on the first passivation layer 140 in each of first, second and third pixel regions P1, P2 and P3. The first electrode 147 is connected to the drain electrode 136 of the driving TFT DTr through the drain contact hole 143.

The first electrode 147 has a double-layered structure including an upper layer 147a and a lower layer 147b. A thickness ratio of the lower layer 147b to the upper layer 147a may be about 1:0.4 to about 1:0.8. For example, the upper layer 147a may have a thickness of about 600 Å to about 800 Å, and the lower layer 147b may have a thickness of about 750 Å to about 2000 Å.

The upper layer 147a of the first electrode 147 may be formed of a transparent conductive material, such as indium-tin-oxide (ITO) or indium-zinc-oxide (IZO), having a relatively high work function of about 4.8 eV to about 5.2 eV to function as an anode supplying a hole to an emitting layer 155. In addition, the lower layer 147b of the first electrode 147 may be formed of a metallic material, such as aluminum (Al), aluminum neodymium (AlNd), silver (Ag), or silver palladium copper (APC), having a relatively high reflectance for a top emission type.

A bank layer 150 is formed on the first electrode 147 at a boundary region between the first, second, and third pixel regions P1, P2 and P3. The bank layer 150 covers an edge portion of the first electrode 147 and exposes a central portion of the first electrode 147. The bank layer 150 may have a single-layered structure including a hydrophobic material or may have a double-layered structure of a first layer including a hydrophilic material and a second layer including a hydrophobic material.

An emitting layer 155 is formed on the first electrode 147 exposed through the bank layer 150. The emitting layer 155 may include first, second, and third emitting layers 155a, 155b, and 155c emitting red, green, and blue colored lights in the first, second and third pixel regions P1, P2 and P3, respectively. The first, second and third emitting layers 155a, 155b, and 155c may have different thicknesses from each other.

A second electrode 165 is formed on the first, second, and third emitting layers 155a, 155b, and 155c. The second electrode 165 may be formed of a metallic material such as aluminum (Al), aluminum neodymium (AlNd), silver (Ag), magnesium (Mg), and magnesium silver (MgAg) having a relatively low work function to function as a cathode supplying an electron to the emitting layer 155.

The second electrode 165 has a reflection property and a transmission property. For example, the second electrode 165 may reflect a portion of the light emitted from the emitting layer 155 toward the first electrode 147 to obtain a microcavity effect. In addition, the second electrode 165 may transmit a portion of the light emitted from the emitting layer 155 to obtain a top emission type. The first electrode 147, the emitting layer 155 and the second electrode 165 constitute a light emitting diode E.

A second substrate 170 for encapsulation is disposed over the first substrate 110. The second substrate 170 may be formed of plastic or glass. Although not shown, an adhesive of sealant or frit is formed at an edge portion between the first and second substrates 110 and 170. The first and second substrates 110 and 170 are attached to each other by the adhesive to form a display panel. A space between the first and second substrates 110 and 170 may have a vacuum state or may be filled with an inert gas.

Although the second substrate 170 for encapsulation faces and is spaced apart from the first substrate 110 in the first embodiment, a film including an adhesive layer instead of the second substrate may be attached to the second electrode 165 in another embodiment. Alternatively, an inorganic insulating layer or an organic insulating layer of a capping layer may be formed on the second electrode 165 as an encapsulation layer and the second substrate may be omitted in another embodiment.

The emitting layer 155 may be formed through an inkjet method. For example, after an emitting material of a liquid phase may be jetted inside the bank layer 150 by an inkjet apparatus, the emitting material may be cured to form the first, second and third emitting layers 155a, 155b, and 155c.

The emitting layer 155 may have a multiple-layered structure for improving an emission efficiency. For example, the first, second, and third emitting layers 155a, 155b, and 155c may includes first, second, and third hole injecting layers (HIL) 156a, 156b, and 156c, first, second, and third hole transporting layers (HTL) 157a, 157b, and 157c, first, second, and third emitting material layers (EML) 158a, 158b, and 158c, and first, second, and third electron injecting layers (EIL) 159a, 159b, and 159c, respectively, sequentially formed on the first electrode 147. Although not shown, first, second, and third electron transporting layers may be formed between the first, second, and third emitting material layers 158a, 158b, and 158c and the first, second, and third electron injecting layers 159a, 159b, and 159c.

Thicknesses of the first, second, and third emitting layers 155a, 155b, and 155c having a multiple-layered structure are different from each other in the first, second, and third pixel regions P1, P2, and P3. Since the first, second, and third pixel regions P1, P2, and P3 emit red, green, and blue colored light having different wavelength bands, the first, second, and third emitting layers 155a, 155b, and 155c have different thicknesses corresponding to the red, green, and blue colored light to obtain a microcavity effect and improve a color reproducibility.

For example, since the first pixel region P1 emits the red colored light having a longest wavelength band, the first pixel region P1 may have a greatest gap distance between the first and second electrodes 147 and 165. In addition, since the third pixel region P3 emits the blue colored light having a shortest wavelength band, the third pixel region P3 may have a smallest gap distance between the first and second electrodes 147 and 165. The second pixel region P2 emitting the green colored light having a middle wavelength band may have a gap distance smaller than the gap distance of the first pixel region P1 but greater than the gap distance of the third pixel region P3.

The gap distance between the first and second electrodes 147 and 165 may be adjusted by the first, second, and third hole injecting layers 156a, 156b, and 156c and the first, second, and third emitting material layers 158a, 158b, and 158c having a relatively great thickness. Since the first, second, and third hole transporting layers 157a, 157b, and 157c and the first, second, and third electron injecting layers 159a, 159b, and 159c have a relatively small thickness less than about 200 Å, the first, second, and third hole transporting layers 157a, 157b, and 157c and the first, second, and third electron injecting layers 159a, 159b, and 159c may be formed by a single drop of the inkjet apparatus. Since the first, second, and third hole injecting layers 156a, 156b, and 156c and the first, second, and third emitting material layers 158a, 158b, and 158c have a relatively great thickness, the first, second, and third hole injecting layers 156a, 156b, and 156c and the first, second, and third emitting material layers 158a, 158b, and 158c may be formed by multiple drops of the inkjet apparatus.

In FIG. 4, first, second, and third hole injecting layers 57a, 57b, and 57c have different thicknesses of about 1200 Å to about 2500 Å in first, second, and third pixel regions P1, P2, and P3. In addition, first, second, and third emitting material layers 58a, 58b, and 58c have different thicknesses of about 500 Å to about 1000 Å in the first, second, and third pixel regions P1, P2, and P3.

Since the first, second, and third hole injecting layers 57a, 57b, and 57c have thicknesses of about 1200 Å to about 2500 Å, the first, second, and third hole injecting layers 57a, 57b, and 57c may be formed by multiple drops, such as five drops of the inkjet apparatus. In the inkjet method, a jetting step of an ink, a first drying step under a low pressure, and a second drying step are performed. Since the first drying step is performed for about 10 minutes to about 999 minutes, productivity per hour may be improved by reducing the number of drops in the jetting step.

An amount by a single drop is limited according to the emitting material. For example, the hole injecting layer may have a maximum thickness of about 600 Å by a single drop according to a viscosity of the material for the hole injecting layer. In addition, the emitting material layer may have a maximum thickness of about 1500 Å by a single drop according to a viscosity of the material for the emitting material layer, and the hole transporting layer may have a maximum thickness of about 300 Å by a single drop according to a viscosity of the material for the hole transporting layer.

When the amount by a single drop increases to obtain a thickness greater than the maximum thickness, the material may overflow the bank layer toward an adjacent pixel region to cause deterioration, such as mixing of colors between adjacent pixel regions. Accordingly, the maximum thickness in a single drop should not be exceeded to avoid deterioration of any of the organic layers in the emitting layer.

In consideration of the maximum thickness by the inkjet method, the first hole injecting layer 56a in the first pixel region P1 emitting the red colored light may be formed to have the thickness of about 2200 Å by four drops of the inkjet apparatus obtaining the maximum thickness of about 600 Å by a single drop.

In FIG. 3, the first, second, and third hole injecting layers 156a, 156b, and 156c in the first, second, and third pixel regions P1, P2, and P3 are formed to have a thickness smaller than about 1200 Å, and the upper layer 147a of the first electrode 147 is formed to have a thickness of about 600 Å to about 800 Å. For example, the first, second, and third hole injecting layers 156a, 156b, and 156c may have thicknesses of about 1200 Å, 600 Å, and 300 Å, respectively. In addition, the upper layers 147a of the first electrode 147 may have a thickness greater than about five times of the thickness of the upper layer 47a of the first electrode 47 of FIG. 4.

Since the upper layer 147a of the first electrode 147 of the first embodiment has a greater thickness as compared with the upper layer 47a of the first electrode 47 of the comparison embodiment, the OLED display device 101 of the first embodiment may have the same microcavity as the OLED display device 1 of the comparison embodiment even when the first, second, and third hole injecting layers 156a, 156b, and 156c of the first embodiment have a smaller thickness as compared with the first, second, and third hole injecting layers 56a, 56b, and 56c of the comparison embodiment. As a result, the first, second, and third hole injecting layers 156a, 156b, and 156c may be formed by at most two drops of the inkjet apparatus and the other organic layers of the first, second, and third emitting layers 155a, 155b, and 155c may be formed by a single drop of the inkjet apparatus. Accordingly, the number of drops in the jetting step of the first embodiment may be reduced as compared with the number of drops in the jetting step of the comparison embodiment.

In the OLED display device 101 of a top emission type, since the lower layer 147b of the first electrode 147 functions as a reflective layer, a gap distance for obtaining a microcavity effect of the light emitted from the first, second, and third emitting layers 155a, 155b, and 155c is defined by a top surface of the lower layer 147b of the first electrode 147 and a bottom surface of the second electrode 165. The upper layer 147a of the first electrode 147 of the first embodiment may be formed to have a greater thickness as compared with the upper layer 47a of the first electrode 47 of the comparison embodiment through a physical vapor deposition (PVD) method, such as a sputtering method, and the first, second, and third hole injecting layers 156a, 156b, and 156c of the first embodiment may be formed to have a smaller thickness as compared with the first, second, and third hole injecting layers 56a, 56b, and 56c of the comparison embodiment through at most two drops of the inkjet apparatus.

In the physical vapor deposition method, because a deposition rate is about 10 Å/sec to about 999 Å/sec, a process time for forming the upper layer 147a of the first electrode 147 through the physical vapor deposition method may increase by about 1 seconds to about 99 seconds even when the thickness of the upper layer 147a of the first electrode 147 increases. Since the process time for forming the emitting layer 155 through the inkjet method is about 10 minutes to about 999 minutes, productivity per hour may be improved by increasing the process time for forming the upper layer 147a of the first electrode 147 and reducing the number of drops in the jetting step for forming the emitting layer 155.

In the OLED display device 101, a thickness ratio of the upper layer 147a of the first electrode 147 to the first emitting layer 155a may be about 1:3 to about 1:4 in the first pixel region P1 for obtaining the same microcavity effect. In addition, a thickness ratio of the upper layer 147a of the first electrode 147 to the second emitting layer 155b may be about 1:2.5 to about 1:3 in the second pixel region P2, and a thickness ratio of the upper layer 147a of the first electrode 147 to the third emitting layer 155c may be about 1:1.5 to about 1:2 in the third pixel region P3 for obtaining the same microcavity effect.

For example, the lower layer 147b of the first electrode 147 may have a thickness of about 1000 Å in the first, second, and third pixel regions P1, P2, and P3, and the upper layer 147a of the first electrode 147 may have a thickness of about 800 Å in the first, second, and third pixel regions P1, P2, and P3. The first, second, and third hole transporting layers 157a, 157b, and 157c may have a thickness of about 200 Å in the first, second, and third pixel regions P1, P2, and P3, and the first, second, and third electron injecting layers 159a, 159b, and 159c may have a thickness of about 40 Å in the first, second, and third pixel regions P1, P2, and P3. In addition, the first, second, and third hole injecting layers 156a, 156b, and 156c may have thicknesses of about 1200 Å, about 600 Å, and about 300 Å, respectively, in the first, second, and third pixel regions P1, P2, and P3. The first, second, and third emitting material layers 158a, 158b, and 158c may have thicknesses of about 900 Å, about 900 Å and about 500 Å, respectively, in the first, second, and third pixel regions P1, P2, and P3.

Thicknesses of the organic layers of the emitting layer 155 may be adjusted under a condition where a thickness ratio of the lower layer 147b to the upper layer 147a is about 1:0.4 to about 1:0.8, a thickness ratio of the upper layer 147a to the first emitting layer 155a is about 1:3 to about 1:4, a thickness ratio of the upper layer 147a to the second emitting layer 155b is about 1:2.5 to about 1:3, a thickness ratio of the upper layer 147a to the third emitting layer 155c is about 1:1.5 to about 1:2, and the organic layers of the emitting layer 155 are formed by at most two drops of the inkjet apparatus. The upper layer 147a may have a thickness of about 600 Å to about 800 Å, and the first, second, and third hole injecting layers 156a, 156b, and 156c may have a thickness equal to or smaller than about 1200 Å.

Table 1 illustrates an emission efficiency and a color reproducibility of a light emitting diode display device according to the first embodiment of the present disclosure and a light emitting diode display device according to a comparison embodiment. The emission efficiency may be defined as a ratio of a luminance to a current and the color reproducibility may be expressed in a Commission Internationale de l'Eclairage (CIE) color space.

TABLE 1

| | | color reproducibility | | |
|---|---|---|---|---|
| | emission efficiency (Cd/A) | CIEx (reference: 0.13) | CIEy (reference: 0.06) | peak wavelength(nm) |
| first embodiment | 4.0 | 0.1301 | 0.0669 | 458 |
| comparison embodiment | 3.7 | 0.1317 | 0.0637 | 454 |

In Table 1, the OLED display device of the first embodiment has CIEx and CIEy coordinates of about 0.1301 and 0.0669, while the OLED display device of the comparison embodiment has CIEx and CIEy coordinates of about 0.1317 and 0.0637. Both of the OLED display device of the first embodiment and the OLED display device of the comparison embodiment meet the reference values of CIEx and CIEy coordinates within an acceptable error. In addition, the OLED display device of the first embodiment has a maximum peak wavelength of about 458 nm, while the OLED display device of the comparison embodiment has a maximum peak wavelength of about 454 nm. The maximum peak wavelengths of the OLED display device of the first embodiment and the OLED display device of the comparison embodiment are similar to each other.

As a result, the color reproducibility of the OLED display device of the first embodiment is similar to the color reproducibility of the OLED display device of the comparison embodiment. The OLED display device of the first embodiment may have the same microcavity effect as the OLED display device of the comparison embodiment.

The OLED display device of the first embodiment has an emission efficiency of about 4.0 Cd/A, while the OLED display device of the comparison embodiment has an emission efficiency of about 3.7 Cd/A. As a result, the OLED display device of the first embodiment may have a superior emission efficiency to the OLED display device of the comparison embodiment.

In the OLED display device 101 of the first embodiment, the first, second, and third hole injecting layers 156a, 156b, and 156c have different thicknesses to be formed by at most two drops of the inkjet apparatus, and the first, second, and third emitting material layers 158a, 158b, and 158c have different thicknesses. In an OLED display device of another embodiment, first, second, and third hole injecting layers may have different thicknesses to be formed by a single drop of the inkjet apparatus, first, second, and third emitting material layers may have different thicknesses, and first, second, and third hole transporting layers may have different thicknesses.

Figure 5:
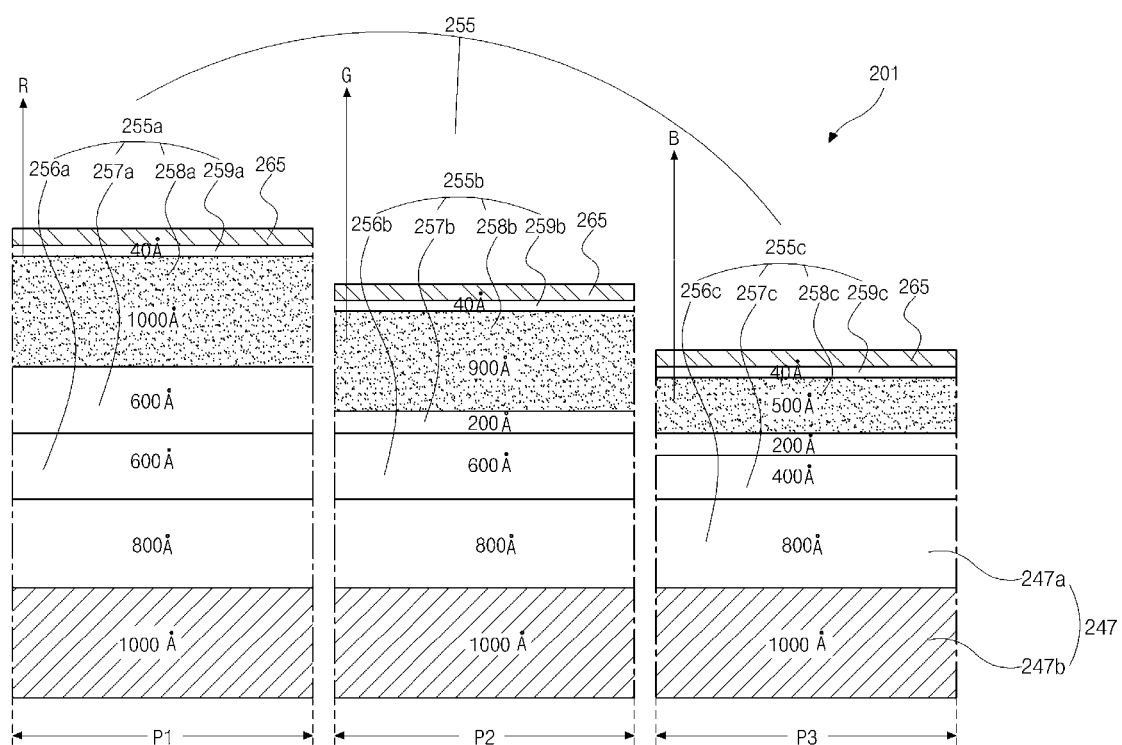
FIG. 5 is a cross-sectional view showing light emitting diodes in three pixel regions of an organic light emitting diode display device according to a second embodiment of the present disclosure.

FIG. 5 is a cross-sectional view showing light emitting diodes in three pixel regions of an organic light emitting diode display device according to a second embodiment of the present disclosure. Since an OLED display device 201 of the second embodiment has the same array element under a light emitting diode E as the OLED display device 101 of the first embodiment, an illustration for the array element under the light emitting diode E will be omitted.

In FIG. 5, the first, second, and third hole injecting layers 256a, 256b, and 256c have different thicknesses, and the first, second, and third emitting layers 258a, 258b, and 258c have different thicknesses. In addition, the first, second, and third hole transporting layers 257a, 257b, and 257c have different thicknesses smaller than about 600 Å. As a result, the maximum thickness of the first, second, and third hole injecting layers 256a, 256b, and 256c is reduced as compared with the first embodiment, and the first, second, and third hole injecting layers 256a, 256b, and 256c may be formed by a single drop of the inkjet apparatus.

For example, the lower layer 247b of the first electrode 247 may have a thickness of about 1000 Å in the first, second, and third pixel regions P1, P2, and P3, and the upper layer 247a of the first electrode 247 may have a thickness of about 800 Å in the first, second, and third pixel regions P1, P2, and P3. The first, second, and third electron injecting layers 259a, 259b, and 259c may have a thickness of about 40 Å in the first, second and third pixel regions P1, P2, and P3. In addition, the first, second, and third hole injecting layers 256a, 256b, and 256c may have thicknesses of about 600 Å, about 600 Å, and about 400 Å, respectively, in the first, second, and third pixel regions P1, P2 and P3, and the first, second, and third hole transporting layers 257a, 257b, and 257c may have thicknesses of about 600 Å, about 200 Å, and about 200 Å, respectively, in the first, second, and third pixel regions P1, P2, and P3. The first, second, and third emitting material layers 258a, 258b, and 258c may have thicknesses of about 1000 Å, about 900 Å, and about 500 Å, respectively, in the first, second, and third pixel regions P1, P2, and P3.

In the OLED display device 201, the first hole injecting layer 256a having the thickness of about 600 Å as well as the second hole injecting layer 256b having the thickness of about 600 Å may be formed by a single drop of the inkjet apparatus. Since the hole transporting layer has a maximum thickness of about 300 Å by a single drop according to a viscosity of the material for the hole transporting layer, the first hole transporting layer 257a having the thickness of about 600 Å may be formed by two drops of the inkjet apparatus. As a result, the first, second, and third hole transporting layers 257a, 257b, and 257c may be formed by at most two drops of the inkjet apparatus. Since the process time for forming the emitting layer 255 of the OLED display device 201 of the second embodiment is similar to the process time for forming the emitting layer 155 of the OLED display device 101 of the first embodiment, productivity per hour of the second embodiment may be improved as compared with the comparison embodiment.

Thicknesses of the organic layers of the emitting layer 255 may be adjusted under a condition where a thickness ratio of the lower layer 247b to the upper layer 247a is about 1:0.4 to about 1:0.8, a thickness ratio of the upper layer 247a to the first emitting layer 255a is about 1:3 to about 1:4, a thickness ratio of the upper layer 247a to the second emitting layer 255b is about 1:2.5 to about 1:3, a thickness ratio of the upper layer 247a to the third emitting layer 255c is about 1:1.5 to about 1:2, and the organic layers of the emitting layer 255 is formed by at most two drops of the inkjet apparatus.

In the OLED display device 201 of the second embodiment, the first, second, and third hole injecting layers 256a, 256b, and 256c are formed on the upper layer 247a of the first electrode 247. In an OLED display device of another embodiment, an auxiliary hole injecting layer may be formed on an upper layer of a first electrode.

Figure 6:
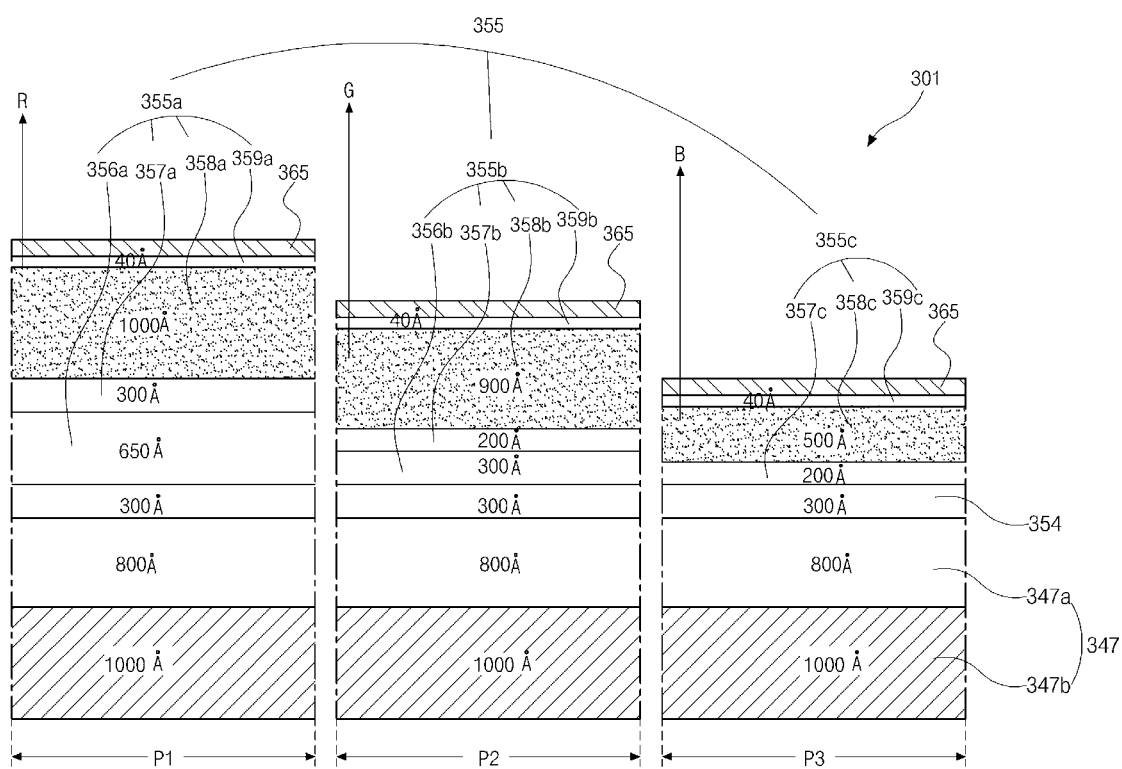
FIG. 6 is a cross-sectional view showing light emitting diodes in three pixel regions of an organic light emitting diode display device according to a third embodiment of the present disclosure.

FIG. 6 is a cross-sectional view showing light emitting diodes in three pixel regions of an organic light emitting diode display device according to a third embodiment of the present disclosure. Since an OLED display device 301 of the third embodiment has the same array element under a light emitting diode E as the OLED display device 101 of the first embodiment, an illustration for the array element under the light emitting diode E will be omitted.

In FIG. 6, an auxiliary hole injecting layer 354 of a metal oxide material having the same thickness is formed on the first electrode 347 in the first, second, and third pixel regions P1, P2, and P3, and the first and second hole injecting layers 356a and 356b are formed on the auxiliary hole injecting layer 354 in the first and second pixel regions P1 and P2. The first and second hole injecting layers 356a and 356b have different thicknesses smaller than about 650 Å, and the first, second, and third hole transporting layers 357a, 357b, and 357c have different thicknesses smaller than about 300 Å. In addition, the first, second, and third emitting layers 358a, 358b, and 358c have different thicknesses. As a result, the maximum thickness of the first and second hole injecting layers 356a and 356b is reduced as compared with the first embodiment, and the first and second hole injecting layers 356a and 356b may be formed by a single drop of the inkjet apparatus. Further, the maximum thickness of the first, second, and third hole transporting layers 357a, 357b, and 357c is reduced as compared with the second embodiment, and the first, second, and third hole transporting layers 357a, 357b, and 357c may be formed by a single drop of the inkjet apparatus.

For example, the lower layer 347b of the first electrode 347 may have a thickness of about 1000 Å in the first, second, and third pixel regions P1, P2, and P3, and the upper layer 347a of the first electrode 347 may have a thickness of about 800 Å in the first, second, and third pixel regions P1, P2, and P3. The auxiliary hole injecting layer 354 of a metal oxide material, such as tungsten oxide ($WO_3$) of molybdenum oxide ($MoO_3$), may have a thickness of about 300 Å. The auxiliary hole injecting layer 354 may be formed through a physical vapor deposition method, such as a sputtering method. The first and second hole injecting layers 356a and 356b may have thicknesses of about 600 Å and about 300 Å, respectively, in the first and second pixel regions P1 and P2. A third hole injecting layer is omitted, and the third hole transporting layer 357c may be formed directly on the auxiliary hole injecting layer 354. The first, second, and third hole transporting layers 357a, 357b, and 357c may have thicknesses of about 300 Å, about 200 Å, and about 200 Å, respectively, in the first, second, and third pixel regions P1, P2, and P3.

The first, second, and third emitting material layers 358a, 358b, and 358c may have thicknesses of about 1000 Å, about 900 Å, and about 500 Å, respectively, in the first, second, and third pixel regions P1, P2, and P3, and the first, second, and third electron injecting layers 359a, 359b, and 359c may have a thicknesses of about 40 Å in the first, second, and third pixel regions P1, P2, and P3. Further, the second electrode 365 may have a thickness smaller than about 200 Å.

In the OLED display device 301, the first hole injecting layer 356a having the thickness of about 650 Å may be formed by a single drop of the inkjet apparatus. In addition, the hole transporting layer 357a having the thickness of about 300 Å may be formed by a single drop of the inkjet apparatus. Since each of the first and second hole injecting layers 356a and 356b, the first, second, and third hole transporting layers 357a, 357b, and 357c, the first, second, and third emitting material layers 358a, 358b, and 358c and the first, second, and third electron injecting layers 359a, 359b, and 359c constituting the emitting layer 355 are formed by a single drop of the inkjet apparatus, productivity per hour may be improved as compared with the first and second embodiment and the comparison embodiment.

Thicknesses of the organic layers of the emitting layer 355 may be adjusted under a condition where a thickness ratio of the lower layer 347b to the upper layer 347a is about 1:0.4 to about 1:0.8, a thickness ratio of the upper layer 347a to a sum of the auxiliary hole injecting layer 354 and the first emitting layer 355a is about 1:3 to about 1:4, a thickness ratio of the upper layer 347a to a sum of the auxiliary hole injecting layer 354 and the second emitting layer 355b is about 1:2.5 to about 1:3, a thickness ratio of the upper layer 347a to a sum of the auxiliary hole injecting layer 354 and the third emitting layer 355c is about 1:1.5 to about 1:2, and the organic layers of the emitting layer 355 are formed by a single drop of the inkjet apparatus.

Consequently, in an OLED display device according to the present disclosure, since the first electrode may have the upper layer of a relatively great thickness, the gap distance between the lower layer of the first electrode and the second electrode may be maintained and the thicknesses of the organic layers of the emitting layer may be reduced with a predetermined ratio. As a result, the OLED display device may have excellent color reproducibility due to a microcavity effect, and productivity per hour for the OLED display device may be improved.

It will be apparent to those skilled in the art that various modifications and variations can be made in an OLED display device of the present disclosure without departing from the sprit or scope of the invention. Thus, it is intended that the present invention covers the modifications and variations of this invention provided they come within the scope of the appended claims and their equivalents.

What is claimed is:

1. An organic electroluminescent device, comprising:
   a substrate having a plurality of pixel regions defined thereon; and
   in each pixel region, at least first, second and third light emitting elements formed on the substrate, each of the first, second, and third light emitting elements including a lower first electrode, an upper first electrode, an organic light emitting, and a second electrode,
   wherein a ratio of a thickness of the upper first electrode to a thickness of the organic light emitting layer in the first light emitting element is 1:3 to 1:4,
   wherein a ratio of a thickness of the upper first electrode to a thickness of the organic light emitting layer in the second light emitting element is 1:2.5 to 1:3, and
   wherein a ratio of a thickness of the upper first electrode to a thickness of the organic light emitting layer in the third light emitting element is 1:1.5 to 1:2.

2. The organic electroluminescent device according to claim 1, wherein the thicknesses of the upper first electrodes of the first, second, and third light emitting elements are the same.

3. The organic electroluminescent device according to claim 1, wherein a ratio of a thickness of the lower first electrode to a thickness of the upper first electrode in each of the first, second, and third light emitting elements are about 1:0.4 to 1:0.8.

4. The organic electroluminescent device according to claim 1, wherein the thickness of the upper first electrode in each of the first, second, and third light emitting elements is between 600 Å and 800 Å.

5. The organic electroluminescent device according to claim 1, wherein the organic light emitting layer includes:
   a hole injecting layer and a hole transport layer between the upper first electrode and an emitting material layer; and
   an electron injecting layer between the emitting material layer and the second electrode.

6. The organic electroluminescent device according to claim 5, wherein thicknesses of the hole injecting layers of the first, second, and third light emitting elements are less than 1200 Å.

7. The organic electroluminescent device according to claim 5, wherein thicknesses of the electron injecting layers of the first, second, and third light emitting elements are the same.

8. The organic electroluminescent device according to claim 5, wherein thicknesses of the hole transport layers of the first, second, and third light emitting elements are the same.

9. The organic electroluminescent device according to claim 5, wherein thicknesses of the hole injecting layers of the first, second, and third light emitting elements are less than 600 Å.

10. The organic electroluminescent device according to claim 5, wherein thicknesses of the hole transport layers of the first, second, and third light emitting elements are less than 600 Å.

11. The organic electroluminescent device according to claim 5, wherein thicknesses of the hole injecting layers of the first, second, and third light emitting elements are different from each other.

12. The organic electroluminescent device according to claim 5, wherein the hole injecting layers of the first and second light emitting elements include an auxiliary hole injecting layer on the upper first electrode and a primary hole injecting layer, and wherein the hole injecting a of the third light emitting element has a single layer structure.

13. The organic electroluminescent device according to claim 12, wherein the auxiliary hole injecting layer has a thickness of up to 300 Å, the primary hole injecting layer has a thickness of up to 600 Å, and the hole transport layer has a thickness of up to 300 Å.

14. The organic electroluminescent device according to claim 5, wherein the hole injecting layer, the hole transport layer, the emitting material layer, the electron injecting layer, and the second electrode are sequentially provided on the upper first electrode.

* * * * *